(12) United States Patent
Ishibashi et al.

(10) Patent No.: US 8,926,754 B2
(45) Date of Patent: Jan. 6, 2015

(54) EPITAXIAL GROWTH SUSCEPTOR

(75) Inventors: Masayuki Ishibashi, Tokyo (JP); John F. Krueger, Albuquerque, NM (US); Takayuki Dohi, Tokyo (JP); Daizo Horie, Tokyo (JP); Takashi Fujikawa, Tokyo (JP)

(73) Assignee: Sumitomo Mitsubishi Silicon Corporation, Tokyo (JP)

(*) Notice: Subject to any disclaimer, the term of this patent is extended or adjusted under 35 U.S.C. 154(b) by 54 days.

(21) Appl. No.: 12/461,820

(22) Filed: Aug. 25, 2009

(65) Prior Publication Data

US 2009/0314210 A1  Dec. 24, 2009

Related U.S. Application Data

(62) Division of application No. 10/483,809, filed as application No. PCT/US02/40842 on Dec. 23, 2002.

(30) Foreign Application Priority Data

Dec. 21, 2001 (JP) ................. 2001-389778

(51) Int. Cl.
```
C23C 16/00      (2006.01)
H01L 21/306     (2006.01)
C30B 25/12      (2006.01)
C23C 16/458     (2006.01)
C30B 29/06      (2006.01)
H01L 21/687     (2006.01)
C23C 16/455     (2006.01)
```
(52) U.S. Cl.
CPC .............. *C30B 25/12* (2013.01); *C23C 16/4584* (2013.01); *C23C 16/4585* (2013.01); *C30B 29/06* (2013.01); *H01L 21/68735* (2013.01); *C23C 16/45519* (2013.01)

USPC ............................................ 118/728

(58) Field of Classification Search
USPC ............ 118/725, 728; 156/345.52; 219/444.1
See application file for complete search history.

(56) References Cited

U.S. PATENT DOCUMENTS

| | | | |
|---|---|---|---|
| 5,133,284 A * | 7/1992 | Thomas et al. | 118/719 |
| 5,191,218 A | 3/1993 | Mori et al. | 250/453.11 |
| 5,200,157 A | 4/1993 | Toya et al. | 422/246 |
| 6,129,047 A | 10/2000 | Nakamura | 118/725 |
| 6,343,183 B1 | 1/2002 | Halpin et al. | 392/416 |
| 6,444,027 B1 | 9/2002 | Yang et al. | 117/200 |
| 2001/0037761 A1 | 11/2001 | Ries et al. | 117/200 |

FOREIGN PATENT DOCUMENTS

| | | |
|---|---|---|
| EP | 1 460 679 A1 | 9/2004 |
| JP | 63-058819 A | 3/1988 |
| JP | H10-144498 A | 5/1998 |
| JP | H11-097369 A | 4/1999 |

(Continued)

*Primary Examiner* — Maureen Gramaglia
(74) *Attorney, Agent, or Firm* — Kubovcik & Kubovcik

(57) ABSTRACT

A susceptor for use in an epitaxial growth apparatus and method where a plurality of circular through-holes are formed in the bottom wall of a pocket in an outer peripheral region a distance of up to about ½ the radius toward the center of the circular bottom wall. The total opening surface area of these through-holes is 0.05 to 55% of the surface area of the bottom wall. The opening surface area of each of the through-holes provided at this outer peripheral region is 0.2 to 3.2 $mm^2$ and the density of the through-holes is 0.25 to 25 per $cm^2$. After a semiconductor wafer is mounted in the pocket, epitaxial growth is carried out while source gas and carrier gas (i.e., reactive gas) is made to flow on the upper surface side of the susceptor and carrier gas is made to flow on the lower surface side.

2 Claims, 20 Drawing Sheets

(56) References Cited

FOREIGN PATENT DOCUMENTS

| | | |
|---|---|---|
| JP | 2000-030894 A | 1/2000 |
| JP | 2000-031061 A | 1/2000 |
| JP | 2000-323556 A | 11/2000 |
| WO | 01/86034 A2 | 11/2001 |

* cited by examiner

EPITAXIAL GROWTH SUSCEPTOR

This application is a division of application Ser. No. 10/483,809, filed Jan. 15, 2004, which is a 371 of International Patent Application No. PCT/US02/040842, filed Dec. 23, 2002, which claims priority based on Japanese Patent Application No. 2001-389778, filed Dec. 21, 2001, and which are incorporated herein by reference.

FIELD OF THE INVENTION

This invention relates to a susceptor for epitaxial growth and an epitaxial growth method, and in particular relates to a susceptor for epitaxial growth and epitaxial growth technology for use in promoting growth of an epitaxial film on the surface of a semiconductor wafer.

BACKGROUND OF THE INVENTION

In recent years, epitaxial wafers where an epitaxial film is formed on the surface of a silicon wafer are widely used as silicon wafers for use with MOS devices. These epitaxial wafers provide improved yield for gate oxidation films of MOS devices, and have superior characteristics such as the reduction of parasitic capacitance, the prevention of soft errors, improved gettering performance, and improved mechanical strength.

With this epitaxial wafer structure, in the prior art where a batch method is implemented so as to perform epitaxial growth process simultaneously on a plurality of silicon wafers, it has become difficult to maintain compatibility with large diameter silicon wafers and single wafer processing epitaxial growth apparatus have therefore mainly been employed. In recent years, epitaxial growth apparatus for use with large diameter wafers capable of performing epitaxial growth process on wafers of a diameter of 300 mm or more have been developed.

With these single wafer type epitaxial growth apparatus, methods of transferring a wafer into and out of the apparatus, and onto a susceptor, can be classified into two types: a type where a wafer is transferred using a Bernoulli chuck method or elevating method using a transportation jig; and a type where the lower surface of the wafer is supported using pins, so that transfer is achieved by raising the pins. However, in each case, a semiconductor wafer is mounted on a single susceptor arranged horizontally in the apparatus. The wafer is then raised to a high temperature using a heat source such as infrared lamps, etc. located around the wafer. Epitaxial growth is then initiated at the wafer surface by flowing a reactive gas over the surface of the wafer at a high-temperature while rotating the susceptor.

The following is a description, with reference to FIG. 19 to FIG. 23, of a susceptor for epitaxial growth and an epitaxial growth method of the prior art.

FIG. 19 is a cross-sectional view schematically showing an epitaxial growth apparatus of the prior art. FIG. 20 is a plane view schematically showing a susceptor for epitaxial growth of the prior art. FIG. 21 is a further cross-sectional view schematically showing a susceptor for epitaxial growth of the prior art. FIG. 22 is a further cross-sectional view schematically showing a design of a susceptor for epitaxial growth of the prior art. FIG. 23 is a further plane view schematically showing of a susceptor for epitaxial growth of the prior art.

As shown in FIG. 19 to FIG. 22, the epitaxial growth apparatus (hereinafter referred to as "apparatus") 1 internally contains an epitaxial film forming chamber (hereinafter referred to as "film forming chamber") 2. This film forming chamber 2 is equipped with an upper dome 3, a lower dome 4, and a dome fitting 5. The upper dome 3 and the lower dome 4 are made from a transparent material such as quartz, etc., with a susceptor 10 and silicon wafer W being heated using a plurality of halogen lamps 6 arranged above and below the apparatus 1.

The susceptor 10 is then rotated as a result of an outer part of the lower surface of the susceptor 10 engaging with a support arm 8 linked to a susceptor rotating shaft 7. A carbon base material, coated on the surface with a SiC film, is adopted as the susceptor 10. The susceptor 10 is disc-shaped as shown in FIG. 20, or is disc-shaped having a recess as shown in FIG. 21, and supports the entire rear surface of the silicon wafer W. This recess is comprised of a pocket 10a housing the silicon wafer W and is comprised of a substantially circular bottom wall and a sidewall surrounding this bottom wall. A total of three through-holes 10b are formed every 120 degrees around the outside of the susceptor 10. Elevating pins 9 for raising and lowering the silicon wafer W are inserted loosely at each through-hole 10b. Elevation of the elevating pins 9 is carried out by a lift arm 11.

A gas supply opening 12 and gas exhaust opening 13 are located facing each other at a position of the dome fitting 5 that faces the susceptor 10. Reactive gas, that has been formed by diluting source gas such as $SiHCl_3$, etc. with hydrogen gas (carrier gas) and mixed with a microscopic amount of dopant, is supplied from the gas supply opening 3 so as to flow parallel (in a horizontal direction) to the surface of the silicon wafer W. The provided reactive gas is exhausted to the outside of the apparatus 1 by gas exhaust outlet 13 after passing over the surface of the silicon wafer W to bring about epitaxial film growth.

In recent years, uniform distribution of resistivity within epitaxial film surfaces has become an extremely important quantitative requirement for epitaxial wafers. However, high-temperature processing is required during epitaxial growth. This causes dopant within the wafer to be diffused outwards during the epitaxial growth process and causes a so-called "autodoping" phenomenon where dopant is diffused outwards and is incorporated into the epitaxial film. This causes unevenness in dopant concentration within the formed epitaxial film and causes the resistivity at the outer edge part of the epitaxial film to decrease, and resistivity distribution across the surface to be uneven. In particular, when epitaxial growth is carried out at a concentration lower than the dopant concentration of the silicon wafer W, this causes regions where the dopant concentration of the epitaxial film is outside of the required specifications to occur and causes device yield to decrease.

In order to prevent the deterioration of the resistivity distribution within the epitaxial film, silicon wafers are coated with a protective film so that autodoping from the silicon wafer W is prevented. Silicon oxide films produced by CVD techniques are typically used as the protective films for preventing autodoping and a polycrystalline silicon film formed on the rear surface of the wafer can contribute to gettering capabilities and may also function as a protective film for reducing autodoping. Typically only the rear surface is coated with the silicon oxide film. The edges of the wafer are not coated, but any out diffusion of dopant from the wafer edge is minimal because of the small surface area.

The use of a wafer having a protective film is therefore effective in suppressing autodoping. However, this requires dedicated equipment such as CVD processing tools, etc. and this requires additional processing. There are also cases that demand the use of an epitaxial wafer where the protective layer must be removed from the rear surface after the epitaxial growth process. This requirement depends on the type of processing required. In this case, it is necessary to perform additional processing such as polishing and etching, etc. in order to remove the protective film after the epitaxial growth process. This additional processing causes the cost of producing epitaxial wafers to increase and in recent years this increased cost has made it impossible to produce low cost epitaxial wafers.

An epitaxial wafer that has been processed with an oxide backseal and then the oxide stripped, has a dopant concentration at the rear surface that is similar to the bulk of the substrate. An epitaxial wafer that has been processed without an oxide backseal has a rear surface that is depleted of dopant concentration. This depleted rear surface may be beneficial for subsequent processing by the device manufacturer. In order to resolve these problems, an epitaxial growth process method has been proposed that employs a susceptor 10 formed with a large number of through-holes 10c over substantially the entire surface of the bottom wall of the pocket 10a of the susceptor 10, as shown, for example, in FIG. 23.

However, when there are through-holes 10c dispersed over substantially the whole surface of the bottom wall of the pocket, degradation of the nanotopology of the surface of the epitaxial wafer occurs due to temperature differences between regions where through-holes 10c are formed and regions where through-holes 10c are not formed and these nanotopographical degradation regions occur across the entire wafer surface.

In the prior art, a region from a central position of the bottom wall of this pocket to a radius of ½ is a region for measuring the temperature of the epitaxial growth process in the epitaxial growth apparatus. When through-holes 10c are then formed in this region, variations occur in measurement of the process temperature and as a result there is an increased possibility that slip will occur in the wafer.

On the other hand, uniform epitaxial film thickness is also an important quantitative demand placed upon epitaxial wafers. The aforementioned reactive gas is supplied to the film-forming chamber 2 in a manner parallel with respect to the surface of the silicon wafer W (FIG. 22). Part of the reactive gas flowing into the film-forming chamber 2 therefore collides with the outer wall of the susceptor 10. As a result, the gas flow of reactive gas is disturbed in the vicinity of the upper edge part of the susceptor 10 and it is therefore difficult for the reactive gas to make sufficient contact with the outer edge surface of the silicon wafer W. As a result, this causes a phenomenon to occur where the epitaxial film of this portion becomes thin compared with the surface portion. This phenomenon occurs regardless of whether or not a protective film for preventing autodoping is present at the rear surface of the silicon wafer W.

Methods have therefore been disclosed in the prior art to prevent lowering of film thickness at the outer parts of the epitaxial film through control of the epitaxial growth process. To give concrete examples, there is a method (1) where the speed of growth of an epitaxial film is lowered, and a method (2) where the height D from the surface of the bottom wall of the susceptor 10 to the upper end surface of the sidewall is lowered. This height D is typically 0.55 to 1.00 mm.

However, according to the method (1) of lowering the growth speed, a longer period of time is required to grow the epitaxial film, and this impacts the productivity with which the silicon wafers are produced. Further, when the susceptor height D is lowered in (2), the silicon wafer W being processed may become miscentered in the pocket 10a as the result of small vibrations.

Moreover, the through-holes 10c in the prior art are formed in a direction perpendicular to the bottom wall of the susceptor 10. When the through-holes are formed perpendicular to the susceptor pocket bottom wall, radiant heat can pass through the through-holes and can be absorbed directly on the rear surface of the silicon wafer. This can cause non-uniform heating of the silicon wafer.

OBJECT OF THE INVENTION

It is therefore an object of the present invention to provide an epitaxial growth susceptor and epitaxial growth method capable of providing uniformity with regards to film thickness of an epitaxial film, to reduce degradation regions regarding nanotopography of the surface of an epitaxial wafer, to prevent the occurrence of slip of the epitaxial film caused by the forming of through-holes in the bottom wall of the pocket, to eliminate the influence of autodoping from the rear surface of the wafer, and capable of improving uniformity of dopant concentration within the epitaxial film surface.

It is a further object of the invention to provide an epitaxial growth susceptor and an epitaxial growth method capable of improving the effects of discharging dopant from the rear surface of the wafer. It is still a further object of the invention to provide an epitaxial growth susceptor and an epitaxial growth method capable of preventing wafer contaminants originating from the susceptor base material. Moreover, it is a still further object of this invention to provide an epitaxial growth susceptor and an epitaxial growth method where epitaxial growth is carried out without forming a protective film on the rear side of the wafer and to thereby lower the cost of the epitaxial wafer.

It is another object of this invention to provide an epitaxial wafer where autodoping does not occur during thermal treatment in device processing.

It is a still further object of the invention to provide an epitaxial growth susceptor and an epitaxial growth method capable of suppressing variations in radiant heat occurring at areas where through-holes are formed and capable of suppressing the occurrence of uneven brightness at the rear surface of a semiconductor wafer.

SUMMARY OF THE INVENTION

In a first aspect of the invention, there is provided an epitaxial growth susceptor (hereinafter sometimes referred to simply as "susceptor") with a pocket formed from a substantially circular bottom wall and a side wall encompassing the bottom wall, where a semiconductor wafer is to be mounted in the pocket. A plurality of through-holes with openings that are substantially circular or polygonal are provided at the bottom wall within an outer periphery region in a radial direction from the outer periphery of the bottom wall to the center, over a distance that is up to approximately ½ of the radius, with the through-holes being included within at least a portion of the region of the bottom wall on which the semiconductor wafer is mounted. The total opening surface area of the plurality of through-holes is 0.05 to 55% of the surface area of the bottom wall.

Circular, elliptical or a similar shape may be given as substantially circular shapes. Triangular, quadrangular, pentagonal, or other angular shapes may be given as polygonal shapes.

The type of wafer is by no means limited. For example, a silicon wafer or gallium arsenide wafer or SOI or selectively grown epitaxial wafers may be used. If the total opening surface area of the plurality of through-holes is smaller than 0.05% of the surface area of the bottom wall, dopant that diffuses outwards from the rear surface of the wafer is not effectively exhausted. Further, when the total opening surface area exceeds 55%, slip begins to occur in the epitaxial wafer and the strength of the susceptor itself decreases due to a temperature difference between the central part and outer periphery of the wafer being large, and there are problems with the susceptor fracturing or the like during the epitaxial reaction.

According to this first aspect of the invention, the plurality of though-holes are provided within an outer periphery region in a radial direction from the outside of the bottom wall to the center over a distance that is up to ½ of the radius. The through-holes are included within at least the region of the bottom wall on which the semiconductor wafer is mounted on. The total surface area of the openings of the through-holes is taken to be 0.05 to 55% of the surface area of the bottom wall. This improves uniformity of film thickness of the epitaxial film. Additionally, nanotopographically degraded regions of the epitaxial wafer surface that occur due to a temperature difference between the regions where a plurality of through-holes are formed in the bottom wall of the pocket and regions where the holes are not formed can be reduced. The slip caused by the forming of through-holes in the bottom wall of the pocket can also be prevented. Further, with semiconductor wafers where influence is exerted by autodoping from the rear surface of the wafer, it is possible to eliminate the influence of autodoping and to improve the uniformity of dopant concentration within the epitaxial film.

In a second aspect of this invention, in the epitaxial growth susceptor there is further provided a support means at the bottom wall or sidewall for supporting the mounted semiconductor wafer through surface contact, line contact or point contact with only the outer periphery of the semiconductor wafer.

According to a susceptor structure where the entire rear surface of the semiconductor wafer is surface-supported, it is difficult for carrier gas such as hydrogen gas to become wrapped around the entire rear surface of the wafer. The effectiveness with which dopant is discharged from the rear surface of the wafer and is exhausted is therefore reduced. To this end, it is effective to form on the susceptor a support means for supporting the wafer by making surface contact, line contact or point contact with the outer periphery of the wafer so that a slight gap is formed between the rear surface of the wafer and the upper surface of the susceptor.

In a third aspect of the invention, a SiC film is adhered to the surface of the susceptor and to inner wall surfaces of each of the through-holes. Exposed surfaces of the susceptor and inner surfaces of the through-holes are coated with a SiC film. Contamination from the susceptor base material, such as carbon contamination, etc., can therefore be reliably prevented.

In a fourth aspect of the invention, at least the portion of the susceptor that includes the through-holes of the susceptor is made of a solid SiC material.

The reason for making the portion of the susceptor that includes the through-holes of a solid SiC material is because it is difficult to coat all of the inside surfaces of the through-holes uniformly and because peeling of the SiC film tends to occur at parts of the inside surfaces of the through-holes. Contamination caused by the susceptor base material can be reliably prevented by forming the susceptor region where the through-holes are formed using a solid SiC material which is fabricated from solid SiC using a CVD technique, etc. It is also possible to form the entire susceptor from a solid SiC material.

In a fifth aspect of the invention, the through-holes of the susceptor are inclined with respect to the thickness direction of the bottom wall.

Namely, each of the through-holes is formed in the bottom wall inclined in such a manner that a central axis of each through-hole is not orthogonal with respect to the bottom wall plane but rather has a prescribed angle. The angle of inclination of (the central axes of) the through-holes with respect to the bottom wall surface is, for example, 20 to 70 degrees. The direction of inclination of the through-holes is by no means limited. Inclination from the upper surface of the bottom wall to the lower surface towards the inside of the bottom wall or towards the outside is possible.

According to the fifth aspect of the invention, the radiant heat occurring at the part of the bottom wall where the through-holes are formed can therefore be decreased compared with the case where the through-holes are not inclined and the occurrence of uneven brightness at the rear surface of the semiconductor wafer can be suppressed.

In a sixth aspect of this invention, there is provided an epitaxial growth susceptor with a pocket formed from a substantially circular bottom wall and a sidewall encompassing the bottom wall, where a semiconductor wafer is to be mounted within the pocket. A plurality of through-holes with openings that are substantially circular or polygonal are provided at the bottom wall within a region or a distance of up to approximately ½ the radius from the outer periphery to the center in a radial direction, with the through-holes being included within at least the region of the bottom wall on which the semiconductor wafer is to be mounted. The opening surface area of each through-hole is taken to be 0.2 to 3.2 $mm^2$, and the density of the through-holes is taken to be 0.25 to 25 holes per $cm^2$.

The reason the through-holes are not formed with an opening surface area less than 0.2 $mm^2$ is because of technical difficulties with mechanical machining precision. When through-holes where the opening surface area exceeds 3.2 $mm^2$ are formed, temperature distribution becomes uneven and nanotopographical degradation and the occurrence of slip becomes marked due to the opening surface area being too large.

On the other hand, when the density of the through-holes is less than 0.25 holes per $cm^2$, the amount of reactive gas flowing decreases and therefore a decrease of the film thickness at the outer periphery of the epitaxial film cannot be prevented, the effectiveness with which dopant discharged from the rear surface of the wafer is also small and therefore the influence of autodoping cannot be eliminated. When through-hole density exceeds 25 per $cm^2$, the strength of the susceptor itself decreases and the susceptor may warp or fracture during the epitaxial growth process.

According to the sixth aspect of the invention, the thickness uniformity of the epitaxial film is improved and the nanotopgraphically degraded regions of the epitaxial wafer surface that occur due to a temperature difference between the regions where a plurality of through-holes are formed in the bottom wall of the pocket and regions where the holes are not formed are reduced. The slip caused by the forming of through-holes in the bottom wall of the pocket can therefore be prevented. In the case of semiconductor wafers where influence is exerted by autodoping from the rear surface of the wafer, it is also possible to eliminate the influence of this autodoping and to improve the uniformity of dopant concentration within the epitaxial film surface.

In a seventh aspect of this invention, the epitaxial susceptor according to the sixth aspect of the invention is further provided with a support means at the bottom wall or sidewall for supporting the mounted semiconductor wafer through surface contact, line contact or point contact with only the outer periphery of the semiconductor wafer.

In an eighth aspect of the invention, a SiC film is adhered to the surface of the susceptor of the sixth aspect of the invention and to inner wall surfaces of each of the through-holes.

In a ninth aspect of the invention, at least the portion of the susceptor of the sixth aspect of the invention that includes the through-holes of the susceptor is made of a solid SiC material.

In a tenth aspect of the invention, the through-holes of the susceptor of the sixth aspect of the invention are inclined with respect to the thickness direction of the bottom wall.

In an eleventh aspect of the invention, there is provided an epitaxial growth method for growing an epitaxial film on a surface of a semiconductor wafer by mounting the semiconductor wafer within the susceptor pocket and supplying source gas and carrier gas to an upper surface side of the susceptor and supplying carrier gas to a lower surface side of the susceptor. The pocket is formed from a substantially round bottom wall and a sidewall encompassing the bottom wall, and a plurality of through-holes with openings that are substantially circular or polygonal are provided at the bottom wall within a region or a distance of up to approximately ½ the radius from the outer periphery to the center, with through-holes being included within at least the region of the bottom wall on which the semiconductor wafer is mounted. The total opening surface area of the plurality of through-holes is 0.05 to 55% of the surface area of the bottom wall.

A gas such as, for example, $SiH_4$, $SiH_2Cl_2$, $SiHCl_3$ or $SiCl_4$ etc., is adopted as the source gas.

Hydrogen gas or an inert gas may be adopted as the carrier gas.

According to the eleventh aspect of the invention, after the semiconductor wafer is mounted within the pocket, epitaxial growth is carried out while flowing source gas and carrier gas on the upper surface side of the susceptor and flowing carrier gas on the lower surface side. Therefore, at the outer periphery of the susceptor, part of the source gas flowing on the upper surface side of the susceptor flows from a gap between the outer periphery of the semiconductor wafer and the sidewall of the susceptor down to the lower surface side of the susceptor via the through-holes as a result of negative pressure created by the carrier gas flowing on the lower surface side of the susceptor. A sufficient amount of source gas can therefore be supplied to the surface of the outer periphery of the wafer. This improves the thickness uniformity of the epitaxial film and reduces the nanotopographically degraded regions of the epitaxial wafer surface that occur due to a temperature difference between the regions where a plurality of through-holes are formed in the bottom wall of the pocket and regions where the holes are not formed because the through-holes are not formed in the region from the center of the bottom wall of the susceptor to a distance of at least ½ of the radius from the center. The slip caused by the forming of through-holes in the bottom wall of the pocket can therefore be prevented.

Further, dopant is diffused outwards from the rear surface of a wafer during an epitaxial growth process when a semiconductor wafer with both front and rear surfaces constituted by a semiconductor single crystal surface is subjected to the epitaxial growth process. However, in the eleventh aspect of the invention dopant is discharged at the lower surface side of the susceptor due to the action of this negative pressure and it is difficult for this dopant to be incorporated into the epitaxial film. As a result, the influence of this autodoping from the rear surface of the wafer can be substantially eliminated and the uniformity of dopant concentration within the epitaxial film surface can be improved. This epitaxial growth process may also be applied to semiconductor wafers with oxide films or polycrystalline films formed on the rear surface thereof where the influence of autodoping is slight. Reduction in film thickness at the outer periphery of the epitaxial film can also be suppressed in this case.

In a twelfth aspect of this invention, there is further provided an epitaxial growth method where the epitaxial growth susceptor in the eleventh aspect of the invention is provided with support means at the bottom wall or sidewall for supporting the mounted semiconductor wafer through surface contact, line contact or point contact with only the outer periphery of the semiconductor wafer.

In a thirteenth aspect of the invention, a SiC film is adhered to the surfaces of the susceptor of the eleventh aspect of the invention and to inner wall surfaces of each of the through-holes.

In a fourteenth aspect of the invention, an epitaxial growth method is provided where at least the portion of the susceptor of the eleventh aspect of the invention that includes the through-holes of the susceptor is made of a solid SiC material.

In a fifteenth aspect of the invention, an epitaxial growth method is provided where the carrier gas supplied to the lower surface side of the susceptor of the eleventh aspect of the invention is hydrogen containing gas supplied at 3 to 100 liters per minute.

When the amount of carrier gas flowing at the lower surface side of the susceptor is less than 3 liters per minute, there is an insufficient amount of negative pressure generated and the dopant does not effectively flow through the susceptor through-holes. In this case the autodoping is excessive. When a flow of 100 liters per minute flow is exceeded, the effectiveness of exhausting the dopant is increased, but the carrier gas including the dopant is not discharged from the gas exhausting opening in an appropriate manner. Part of the carrier gas flows into the source gas and the distribution of resistivity within the epitaxial film deteriorates.

In a sixteenth aspect of the invention, an epitaxial growth method is provided where the through-holes of the epitaxial growth susceptor of the eleventh aspect of the invention are inclined with respect to the thickness direction of the bottom wall.

In a seventeenth aspect of the invention, there is provided an epitaxial growth method for growing an epitaxial film on a surface of a semiconductor wafer by mounting the semiconductor wafer within the susceptor pocket and supplying source gas and carrier gas to an upper surface side of the susceptor and supplying carrier gas to a lower surface side of the susceptor. The pocket is formed from a substantially round bottom wall and a sidewall encompassing the bottom wall, and a plurality of through-holes with openings that are substantially circular or polygonal are provided at the bottom wall within a region a distance of up to approximately ½ the radius from the outer periphery to the center, with the through-holes being included within at least the region of the bottom wall on which the semiconductor wafer is mounted. The opening surface area of each through-hole is taken to be 0.2 to 3.2 $mm^2$, and the density of the through-holes is taken to be 0.25 to 25 per $cm^2$.

According to the seventeenth aspect of the invention, after the semiconductor wafer is mounted within the pocket of the susceptor, epitaxial growth is carried out while flowing source gas and carrier gas on the upper surface side of the susceptor and flowing carrier gas on the lower surface side. At this time, a negative pressure force acts at the outer peripheral part of the susceptor due to carrier gas flowing on the lower surface side of the susceptor causing part of the source gas flowing on the upper surface side of the susceptor to flow to the lower surface side of the susceptor via the through-holes. As a result, a sufficient amount of source gas can also be supplied to the surface of the outer periphery of the wafer, and the thickness of the epitaxial film can be made uniform. This uniformity of the epitaxial film can therefore be achieved regardless of whether or not a protective film for preventing autodoping is present at the rear surface of the silicon wafer. Nanotopographically degraded regions of the epitaxial wafer surface that occur due to a temperature difference between the regions where a plurality of through-holes are formed in the bottom wall of the pocket and regions where the holes are not formed can be reduced. The slip caused by the forming of through-holes in the bottom wall of the pocket can be prevented.

Further, dopant is diffused outwards from the rear surface of the wafer during the epitaxial growth process in the case of a semiconductor wafer with both front and rear surfaces constituted by a semiconductor single crystal surface. However, dopant diffused outwards is exhausted to the lower surface side of the susceptor due to the action of the negative pressure. It is therefore difficult for the dopant to be taken into the epitaxial film. As a result, the influence of this autodoping from the rear surface of the wafer can be eliminated and the uniformity of dopant concentration within the epitaxial film surface can be improved.

In an eighteenth aspect of this invention, there is further provided an epitaxial growth method where the epitaxial growth susceptor of the seventeenth aspect of the invention is provided with a support unit at the bottom wall or sidewall for supporting the mounted semiconductor wafer through surface contact, line contact or point contact with only the outer periphery of the semiconductor wafer.

In a nineteenth aspect of the invention, an epitaxial growth method is provided where a SiC film is adhered to the surface of the susceptor of the seventeenth aspect of the invention and to inner wall surfaces of each of the through-holes in the epitaxial growth method.

In a twentieth aspect of the invention, an epitaxial growth method is provided where at least the portion of the susceptor of the seventeenth aspect of the invention that includes the through-holes of the susceptor is made of a solid SiC material.

In a twenty-first aspect of the invention, an epitaxial growth method is provided where the carrier gas supplied to the lower surface side of the susceptor of the seventeenth aspect of the invention is hydrogen containing gas supplied at 3 to 100 liters per minute.

In a twenty-second aspect of the invention, an epitaxial growth method is provided where the through-holes of the susceptor of the seventeenth aspect of the invention are inclined with respect to the thickness direction of the bottom wall.

PREFERRED EMBODIMENTS OF THE INVENTION

Figure 1:
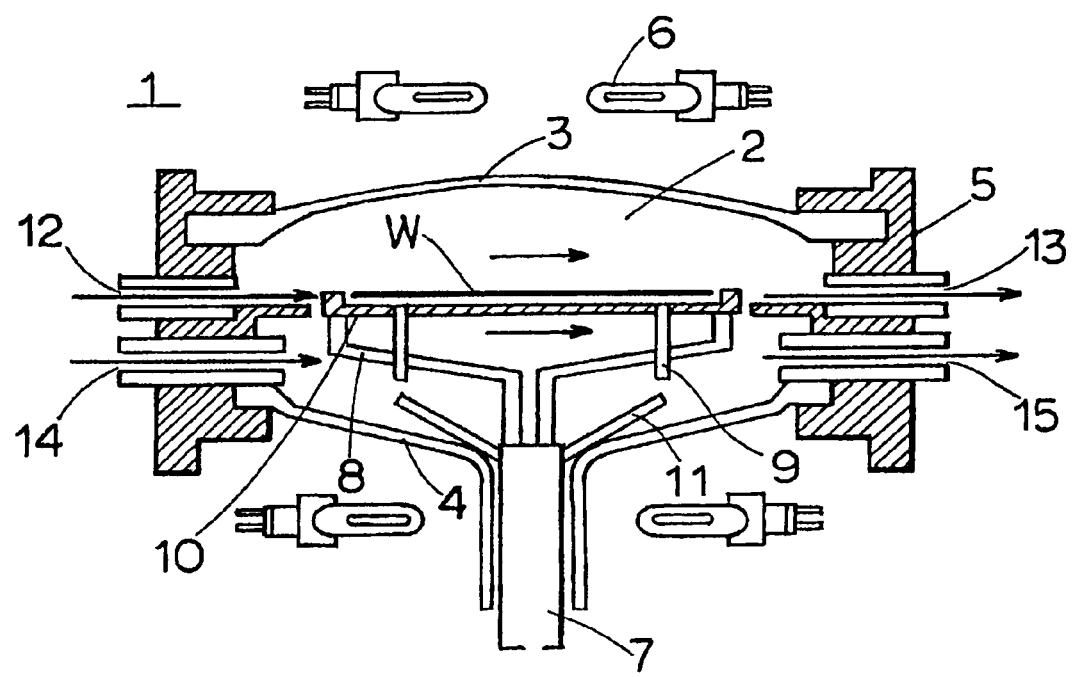
FIG. 1 is a cross-sectional view schematically showing an epitaxial growth apparatus on which is mounted an epitaxial growth susceptor of a first embodiment of this invention.
Figure 2:
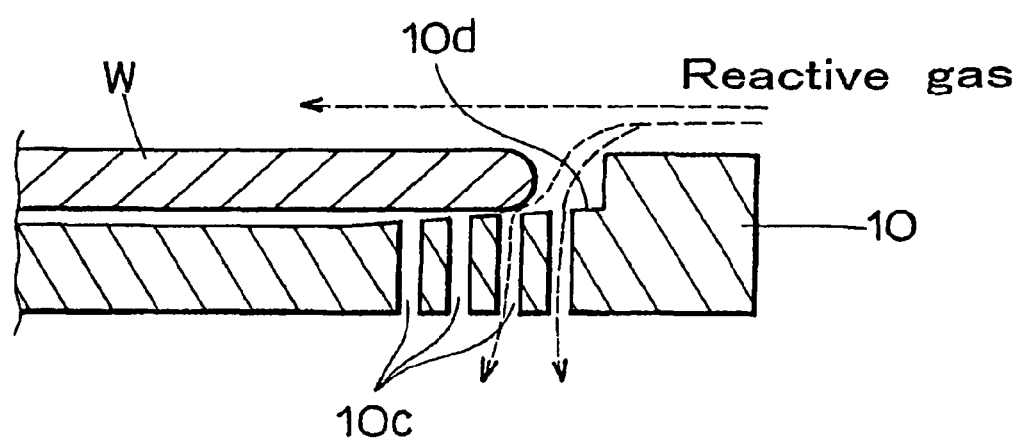
FIG. 2 is an enlarged cross-sectional view schematically showing the essential parts of a usage state of a susceptor for epitaxial growth of a first embodiment of this invention.
Figure 3:
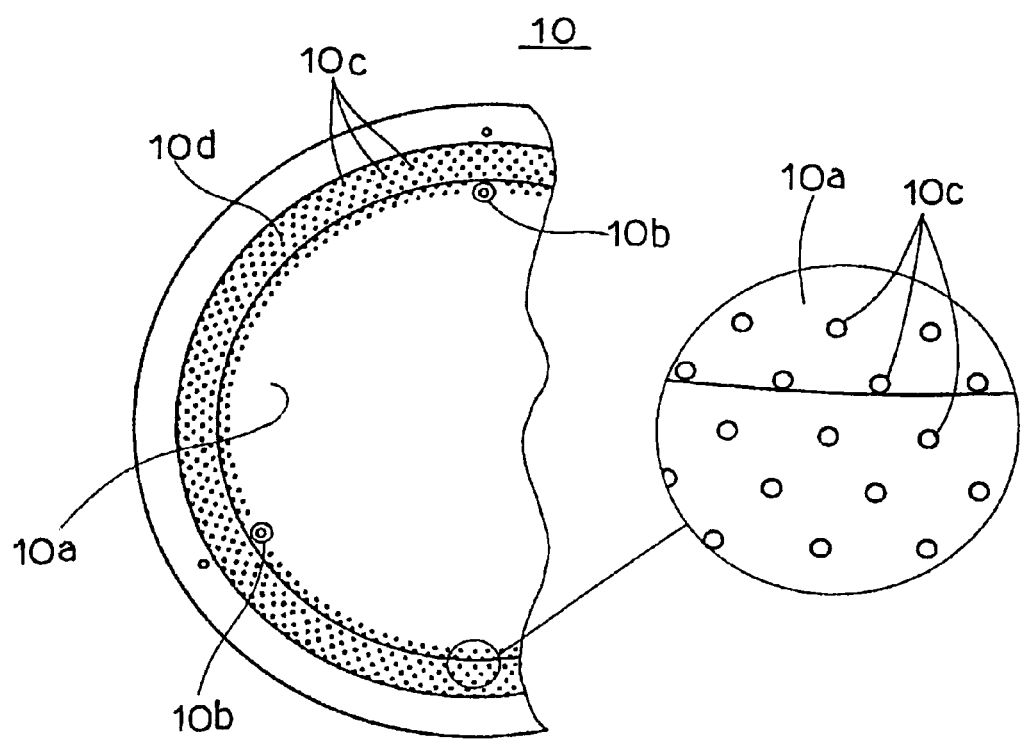
FIG. 3 is a plan view showing essential parts of a susceptor for epitaxial growth of a first embodiment of this invention.
Figure 4:
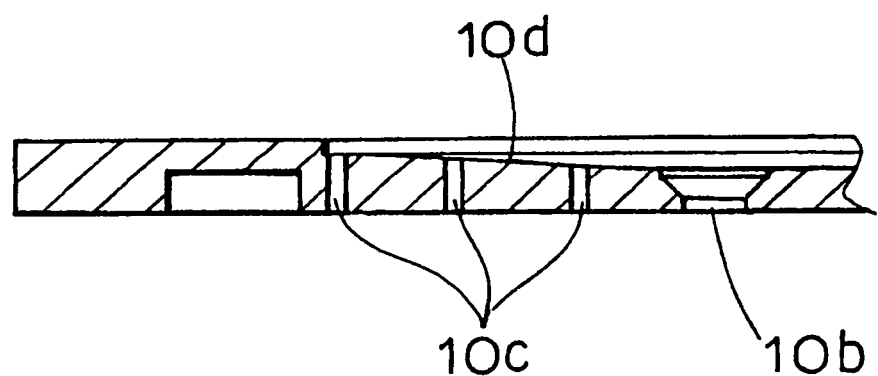
FIG. 4 is an enlarged cross-sectional view showing essential parts of a susceptor for epitaxial growth of a first embodiment of this invention.

The following is a description of a susceptor for epitaxial growth and an epitaxial growth method of embodiments of this invention. The present invention is by no means limited by the following embodiments. FIG. 1 is a cross-sectional view schematically showing an epitaxial growth apparatus in which is mounted an epitaxial growth susceptor of a first embodiment of this invention. FIG. 2 is an enlarged cross-sectional view schematically showing essential parts of a usage state of a susceptor for epitaxial growth of the first embodiment of this invention. FIG. 3 is a plan view showing essential parts of a susceptor for epitaxial growth of the first embodiment of this invention. FIG. 4 is an enlarged cross-sectional view showing essential parts of a susceptor for epitaxial growth of the first embodiment of this invention.

Figure 5:
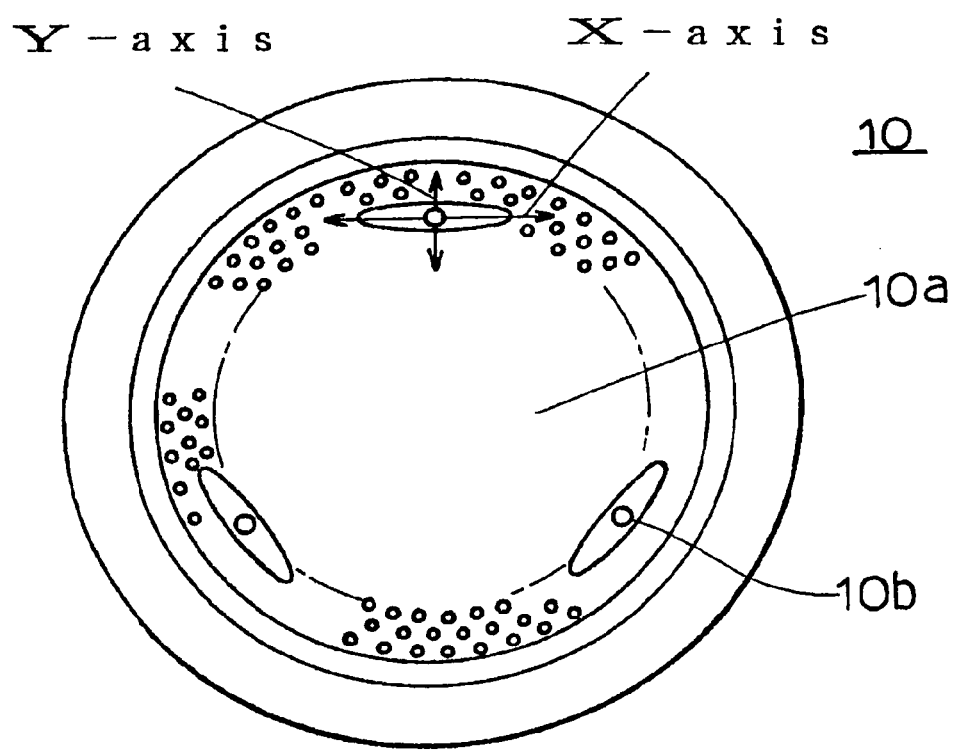
FIG. 5 is a plan view schematically showing a susceptor for epitaxial growth of a further embodiment of this invention.
Figure 6:
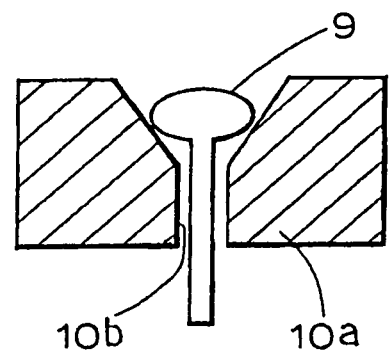
FIG. 6 is a cross-sectional view schematically showing the essential parts of a susceptor for epitaxial growth of a further embodiment of this invention.
Figure 7:
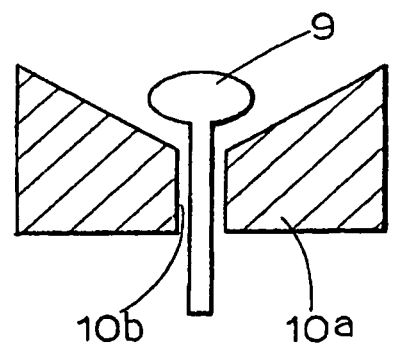
FIG. 7 is a cross-sectional view schematically showing the essential parts of a susceptor for epitaxial growth of a further embodiment of this invention.

FIG. 5 is a plan view schematically showing a susceptor for epitaxial growth of a further embodiment of this invention. FIG. 6 is a cross-sectional view schematically showing essential parts of a susceptor for epitaxial growth of the further embodiment of this invention. FIG. 7 is a cross-sectional view schematically showing the essential parts of a susceptor for epitaxial growth of the further embodiment of this invention.

As shown in FIG. 1 to FIG. 4, the epitaxial growth apparatus (hereinafter referred to as "apparatus") 1 internally contains an epitaxial film forming chamber 2. This film forming chamber 2 is equipped with an upper dome 3, a lower dome 4, and a dome fitting 5. The upper dome 3 and the lower dome 4 are made from a transparent material such as quartz, etc., with a plurality of halogen lamps 6 for heating, a susceptor 10 and silicon wafer W arranged above and below the apparatus 1. The silicon wafer W used is, for example, a P-type silicon single crystal wafer 200 mm in diameter, 740 μm thick, with surface planar orientation (100), a resistivity of 15 mΩcm (milli-ohm-cm) and with one side having a mirrored finish. There is no silicon oxide film (protective film) formed on the rear side of the silicon wafer and both sides of the wafer are single crystal silicon surfaces.

A gas supply opening 12 and gas exhaust opening 13 are located facing each other at a position of the dome fitting 5 that faces the susceptor 10. Reactive gas, that has been formed by diluting a source gas such as SiHCl₃ etc. with hydrogen gas (carrier gas) and mixed with a microscopic amount of dopant, is supplied from the gas supply opening 12 so as to flow parallel (in a horizontal direction) to the surface of the silicon wafer W. The provided reactive gas is exhausted to the outside of the apparatus 1 by a gas exhaust outlet 13 after passing over the surface of the silicon wafer W to bring about epitaxial film growth.

Further, at the dome fitting 5, a gas supply opening 14 for supplying carrier gas such as hydrogen gas, etc. is formed at the side of the lower surface of the susceptor 10 below the gas supply opening 12. Moreover, a gas exhaust opening 15 for exhausting hydrogen gas supplied from the gas supply opening 14 to the outside is also provided at the dome fitting 5 in the vicinity below the gas exhaust outlet 13. It is also possible to not provide the gas exhaust opening 15 and instead have the gas exhaust outlet 13 also exhaust the carrier gas etc. for epitaxial growth.

A description is now given with reference to FIG. 2 to FIG. 4 of a susceptor 10 of this embodiment. This invention is, however, by no means limited to the susceptor 10.

The susceptor 10 is rotated as a result of an outer part of the lower surface of the susceptor 10 engaging with a support arm 8 linking with a susceptor rotating shaft 7. This susceptor 10 has a pocket 10a formed from a circular bottom wall of a diameter of up to 215 mm, which is slightly larger than the diameter of the silicon wafer W, and a cylindrical sidewall surrounding the bottom wall. The bottom wall and sidewall are made from carbon materials with a SiC film adhered to the surface. A silicon wafer is then housed in and mounted on this pocket 10a. The size of the susceptor can be changed in an appropriate manner according to the diameter of the silicon wafer W. To summarize, it is preferable for the susceptor 10 to be of a size where there is a gap in the order of 1 to 10 mm between the outer edge of the pocket 10a and the outer edge of the silicon wafer W. The depth of the pocket 10a, i.e. the height from the upper surface of the bottom wall of the susceptor 10 to the upper edge surface of the sidewall, is substantially the same as the thickness of the silicon wafer, at 800 μm. Further, a total of three through-holes 10b for pins that support and raise the silicon wafer W up and down are arranged at 120 degree intervals in a circumferential direction at the outer periphery of the bottom wall. Elevating pins 9 for raising and lowering the silicon wafer W are inserted loosely at each of the three through-holes 10b. Each elevating pin 9 is provided so as to be raised and lowered freely with respect to the support arm 8. The elevating pins 9 are raised and lowered by a plurality of lift arms 11 provided separately from the support arm 8 at the susceptor rotating shaft 7 in such a manner as to enable raising and lowering.

Further, a plurality of through-holes 10c are provided for preventing the reduction of the epitaxial film grown at the outer periphery of the surface of the wafer and for discharging dopant from the rear surface of the silicon wafer W that occurs at the outer periphery of the bottom wall. Specifically, through-holes 10c are formed in a range 20 mm from the outer edge of the bottom wall of the pocket 10a towards the inside in a radial direction of the wafer.

First, a description is given of the through-holes 10b. During epitaxial growth, the elevating pins 9 are held within the through-holes 10b so that the insides of the through-holes 10b are substantially closed over. The through-holes 10b therefore play little part as through-holes for discharging dopant. The through-holes 10b for use in raising and lowering the wafer are not necessary for epitaxial growth apparatus where the wafer is transported using a Bernoulli chuck method, etc.

A combined function of through-holes 10b as through-holes for discharging dopant can also be achieved by providing recesses within the through-holes 10b used for raising and lowering the wafer so that gas flows through (FIG. 5). Specifically, as shown in FIG. 6, there are slots supporting both ends (in the direction of the Y axis) of the head part of an elevating pin 9 in a contacting manner, and, as shown in FIG. 7, there are slots supporting both ends (in the direction of the X axis) of the head part of the elevating pin 9 in a non-contacting manner. In this case, it is preferable to subject the bottom wall surface layer part of the pocket 10a to mesh processing in order to promote gas flow within the through-holes 10b.

Next, a description is given of the through-holes 10c. The through-holes 10c are formed in the bottom wall (having a diameter of 216 mm) so as to appear as circular holes as viewed from above. In the embodiment shown in FIG. 3, there are seven rows of holes and a total of 834 holes. Each hole has a diameter of 1 mm, and an opening surface area of 0.79 mm², and the density of the holes is 7.3/cm². The total opening surface area of the through-holes 10c is 1.8% of the surface area of the bottom wall. The through-holes 10c are formed at least within the region of the susceptor 10 above which the susceptor 10 is positioned. At least one row of holes and, preferably, at least two rows of holes having a size and density as described above are provided in this region. When through-holes 10c are formed in the peripheral region (only outer side region of the wafer) of a susceptor 10 of a size exceeding the diameter of the wafer, the effects of discharging the dopant gas discharged from the rear surface of the wafer are reduced and the influence of the autodoping cannot be eliminated.

As shown in FIG. 2 and FIG. 4, a support means 10d supporting the outer peripheral part of the silicon wafer W in a line contact state is provided at the bottom wall of the pocket 10a in a tapered shape inclined in a direction from the outside towards the inside (inclined surface). A space of at least 100 μm is therefore formed at a central part of the mounted silicon wafer W between the rear surface of the wafer and the bottom wall of the pocket 10a. This promotes the wrapping around of hydrogen gas to the rear surface of the wafer and enhances the discharging of dopant from the rear surface of the wafer.

Figure 8:
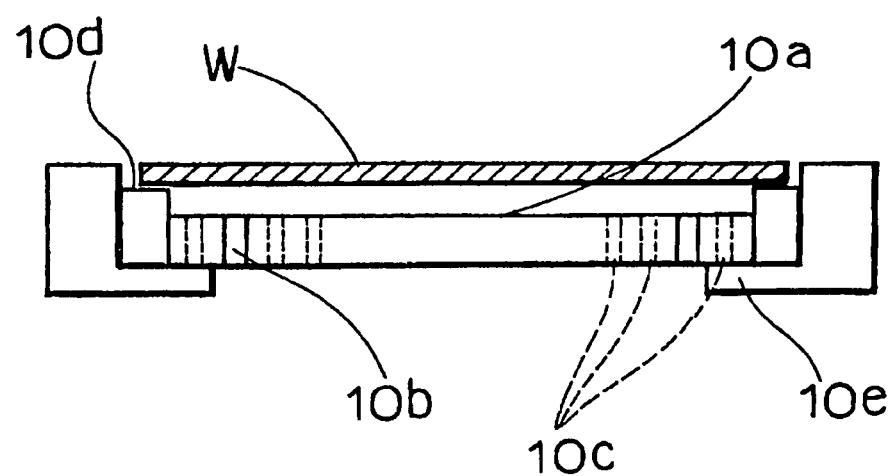
FIG. 8 is a cross-sectional view schematically showing a susceptor for epitaxial growth of another embodiment of this invention.
Figure 9:
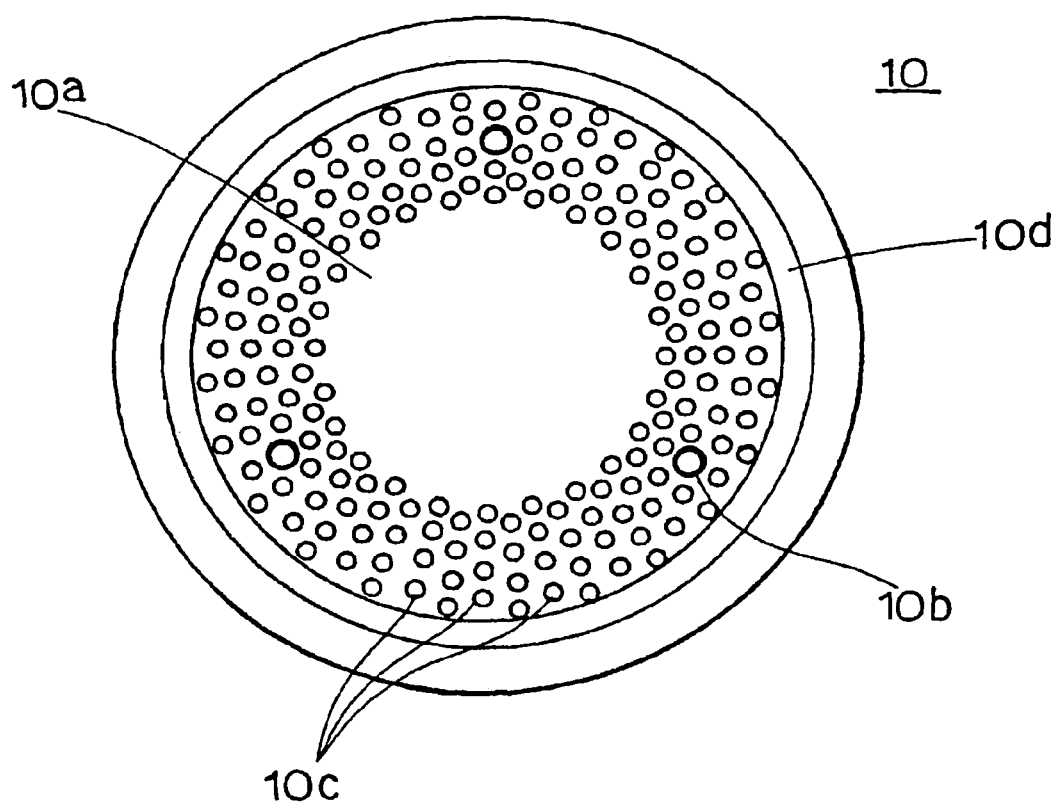
FIG. 9 is a plan view schematically showing a susceptor for epitaxial growth of a further embodiment of this invention.
Figure 11:
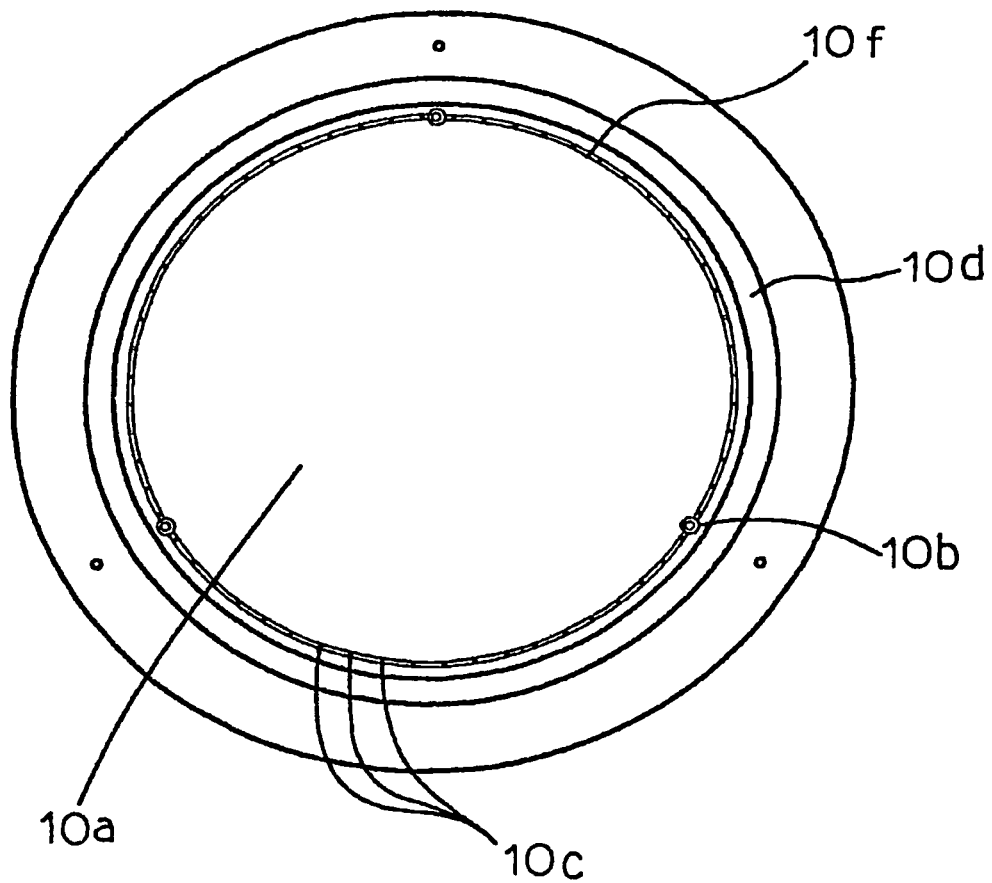
FIG. 11 is a plan view schematically showing a susceptor for epitaxial growth of a further embodiment of this invention.

FIG. 8 is a cross-sectional view schematically showing a susceptor for epitaxial growth of another embodiment of this invention. FIG. 9 is a plane view schematically showing the susceptor for epitaxial growth of FIG. 8. FIG. 11 is a plane view schematically showing the susceptor for epitaxial growth of another embodiment of this invention, in which through-holes are formed at the bottom wall of the pocket 10a and are connected by a shallow channel 10f.

As shown in FIG. 8, the support unit 10d may also be configured so as to support the silicon wafer W. by making contact with the surface at just the outer peripheral part of the silicon wafer. Uneven portions may also be provided on the surface of the support unit 10d, with support then being achieved by point-contact between the surface and the outer peripheral part of the silicon wafer W.

The susceptor 10 of FIGS. 8 and 9 can be formed using different materials for the bottom wall and the sidewall. Namely, the whole of the bottom wall of the pocket 10a where the through-holes 10c are formed using a solid SiC material, and the sidewall of the pocket 10a is a carbon base material coated with a SiC (silicon carbide) film. Carbon contaminants coming from the base material of the susceptor 10 can be effectively eliminated using this coating.

In order to take into consideration the temperature distribution of the inner surface of the susceptor 10, the though-holes are formed over the whole of an outer peripheral region in a radial direction from the outside to the center of the bottom wall of the pocket 10 to a distance that is approximately ½ of the radius.

Figure 10:
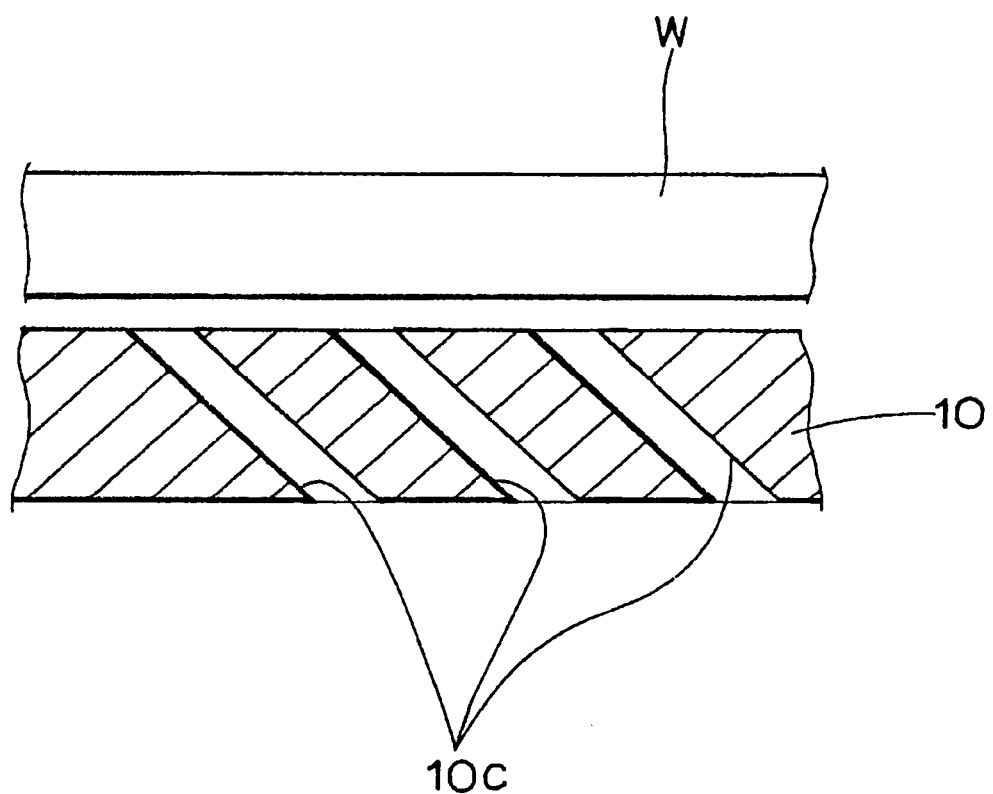
FIG. 10 is a cross-sectional view schematically showing essential parts of a susceptor for epitaxial growth of a still further embodiment of this invention.

FIG. 10 is an example where through-holes 10c formed in the outer peripheral region of the susceptor 10 are inclined by 45 degrees with respect to the thickness direction of the bottom wall. The radiant heat can therefore be suppressed in the region where the through-holes 10c are formed in the bottom wall by inclining the through-holes 10c within a range of 20 degrees to 70 degrees with respect to the thickness direction of the bottom wall and the occurrence of uneven brightness at a rear surface of the silicon wafer W can be suppressed.

FIG. 11 is an embodiment of a susceptor of the present invention in which a row of through-holes is provided in the outer peripheral region of the susceptor within the region of the susceptor on which the wafer is mounted, with the holes being connected by a shallow channel, or trench. The width of the trench is typically slightly greater than the diameter of the through-holes up to about 1.5 times the diameter. The trench has a depth such that the cross-sectional area of the trench is from about 50% to 100% of the opening surface area of a through-hole and, preferably, is close to that of a through-hole. From a manufacturing standpoint, the bottom of the trench is typically flat. This embodiment of the susceptor provides the following advantages. (1) Autodoping caused by dopant diffusing out from the wafer backside at the periphery of the wafer can be effectively controlled by locating the through-holes only at the outer periphery of the wafer. (2) By locating the through-holes only at the periphery there is an improvement in the nanotopology at the center of the wafer, i.e., a reduction in through-holes produces improved nanotopology. (3) The trench provides a gap between the wafer and susceptor at the periphery of the wafer which provides a path for improved mobility of dopant gas to be exhausted out the through-holes. (4) Since the trench improves the mobility of the dopant gas, the density of through-holes can be further reduced and this further improves nanotopology. (5) A shallow trench has a smaller impact on nanotopology degradation than a through-hole because there is still sufficient susceptor mass to maintain a uniform thermal distribution which is a cause of nanotopology degradation. It is noted that although only one row of holes is shown in FIG. 11, more than one row can be provided.

TEST EXAMPLE AND COMPARATIVE EXAMPLE

A description will now be given of an epitaxial growth method for a single wafer epitaxial growth apparatus mounted within a susceptor 10 as illustrated in FIG. 3.

First, a CZ silicon wafer W with the surface polished to a mirrored finish in the usual manner is mounted within the pocket 10a of the susceptor 10.

Then, after the silicon wafer W is treated by baking in hydrogen at 1150° C. for twenty seconds, a mixed reactive gas of a silicon source gas of $SiHCl_3$ and a boron source gas of $B_2H_6$ diluted in hydrogen gas is supplied to the apparatus 1 at a rate of 50 liters per minute so that a P-type epitaxial film of a thickness of approximately 6 μm and resistivity of 10 Ωcm is formed on the wafer surface at an epitaxial growth temperature of 1070° C.

Reactive gas supplied from the reactive gas supply opening 12 passes through the film forming chamber 2 where the susceptor and silicon wafer W are heated by a plurality of halogen lamps 6 arranged above and below the apparatus 1 and is exhausted from the apparatus 1 from the gas exhaust outlet 13 during the formation of the epitaxial film on the surface of the silicon wafer W. Hydrogen gas is supplied from the gas supply opening 14 to within the film forming chamber 2 at a flow rate of 15 liters per minute so as to pass through the lower surface side of the susceptor 10 and after this, the hydrogen gas is exhausted from the gas exhaust opening 15.

In this case, a susceptor 10 (as shown in FIG. 3) is employed with a plurality of through-holes 10c provided in the outer peripheral region of the bottom wall so that the total opening surface area of the through-holes 10c is 1.8% of the surface area of the bottom wall. Namely, after the silicon wafer W is mounted within the pocket 10a, reactive gas is made to flow on the upper surface side of the susceptor 10 and epitaxial growth then takes place while hydrogen gas is made to flow on the lower surface side. At this time, as shown in FIG. 2, a negative pressure force acts at the outer peripheral part of the susceptor 10 due to the hydrogen gas flowing at the lower surface side of the susceptor 10, and part of the reactive gas flowing at the upper surface side of the susceptor 10 flows to the lower surface side of the susceptor 10 via the through-holes 10c. As a result, a large amount of reactive gas comes into contact with the surface of the outer peripheral part of the wafer. This improves the uniformity of the epitaxial film and reduces the nanotopographically degraded regions of the epitaxial wafer surface that occur due to a temperature difference between the regions where a plurality of through-holes are formed in the bottom wall of the pocket and regions where the holes are not formed. The occurrence of slip to the epitaxial film which can occur when through-holes are formed in the bottom wall of the pocket can therefore be prevented.

Further, a silicon oxide film for preventing autodoping is not formed at the rear surface of the silicon wafer W and therefore both front and rear surfaces of the wafer can be configured from silicon single crystal surfaces. Dopant (boron) is therefore diffused outwards from the rear surface of the wafer during the epitaxial growth process. However, dopant diffused outwards is exhausted to the lower side of the susceptor 10 due to the action of the aforementioned negative pressure force. It is therefore difficult for the dopant to be taken into the epitaxial film. As a result, the dopant concentration of the epitaxial film is lower than the dopant concentration of the silicon wafer W. Therefore, even in cases where the influence of autodoping from the rear surface of the wafer is substantial, this influence is eliminated and the uniformity of dopant concentration within the epitaxial film surface is improved.

The results of comparing the test example of this invention based on the above-described embodiment of this invention and a comparative example of the prior art are described below.

Figure 20:
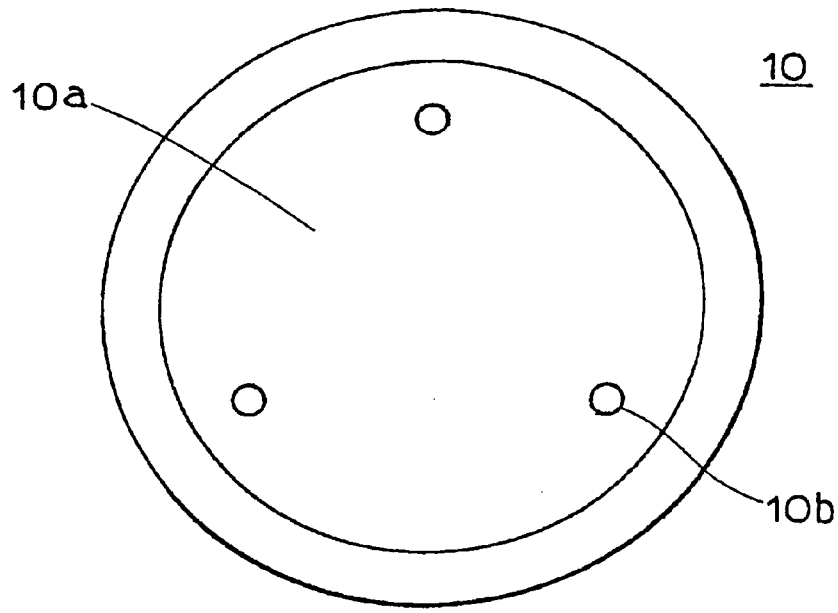
FIG. 20 is a plan view schematically showing a susceptor for epitaxial growth of the prior art.
Figure 21:
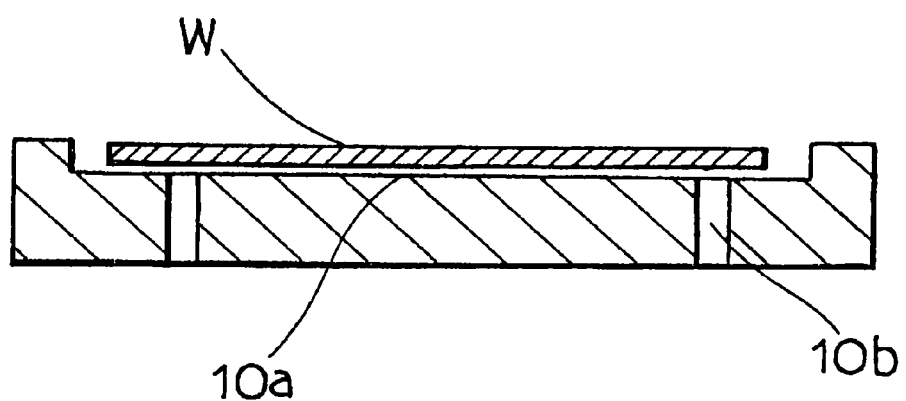
FIG. 21 is a further cross-sectional view schematically showing a susceptor for epitaxial growth of the prior art.
Figure 22:
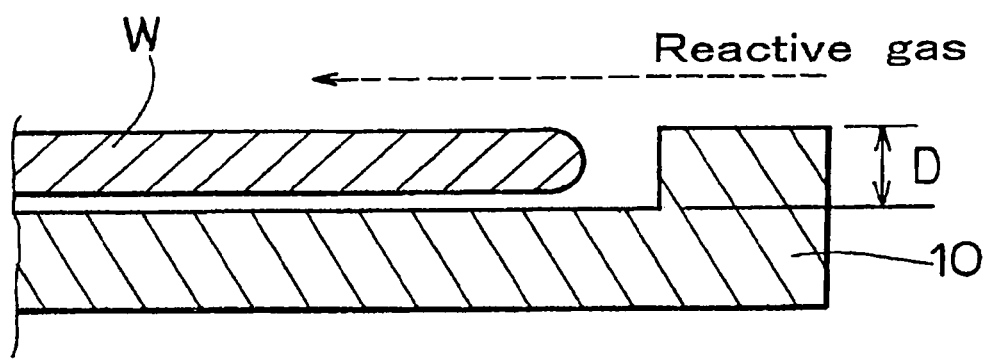
FIG. 22 is a further cross-sectional view schematically showing a usage state of a susceptor for epitaxial growth of the prior art.
Figure 23:
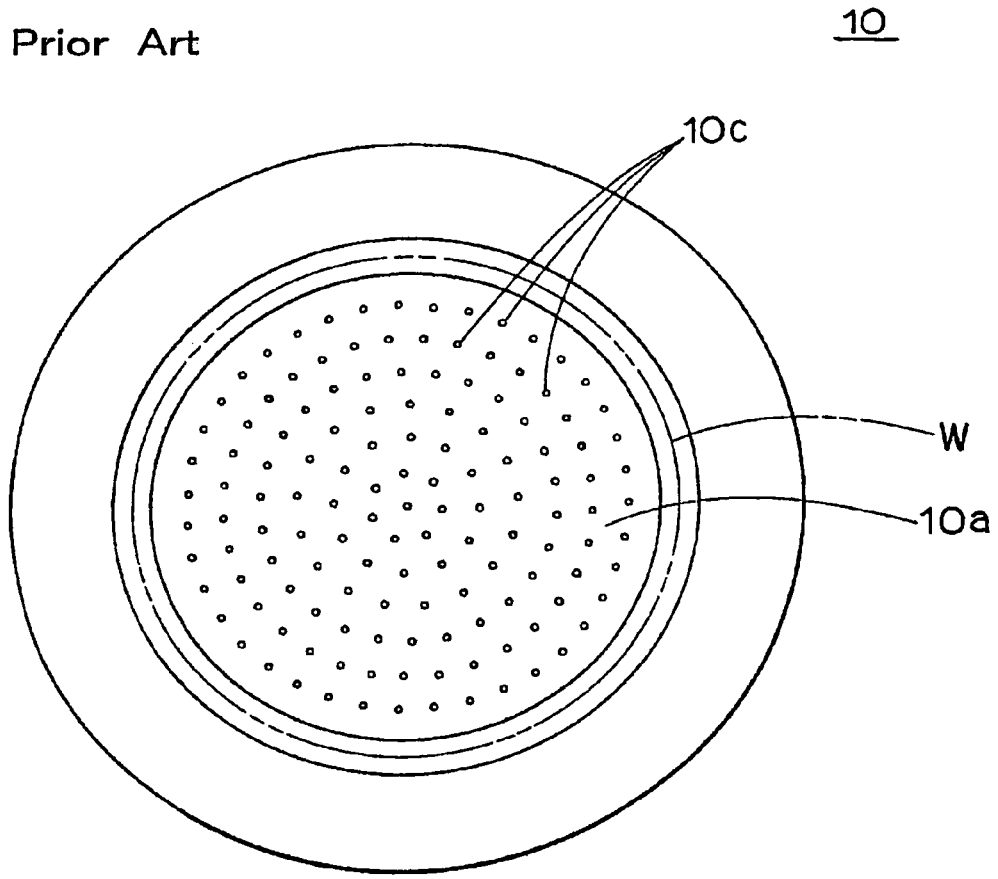
FIG. 23 is a further plan view schematically showing a usage state of a susceptor for epitaxial growth of the prior art.

In the comparative example, as with the test example of this invention, the single wafer epitaxial growth apparatus shown in FIG. 1 is used and hydrogen gas is supplied at a rate of 15 liters per minute from the gas supply opening 14 in order to prevent silicon from becoming deposited on or in furnace members below the film-forming chamber 2 such as the rotating shaft 7 of the susceptor 10. The susceptor 10 used is one as shown in FIG. 20.

Figure 12:
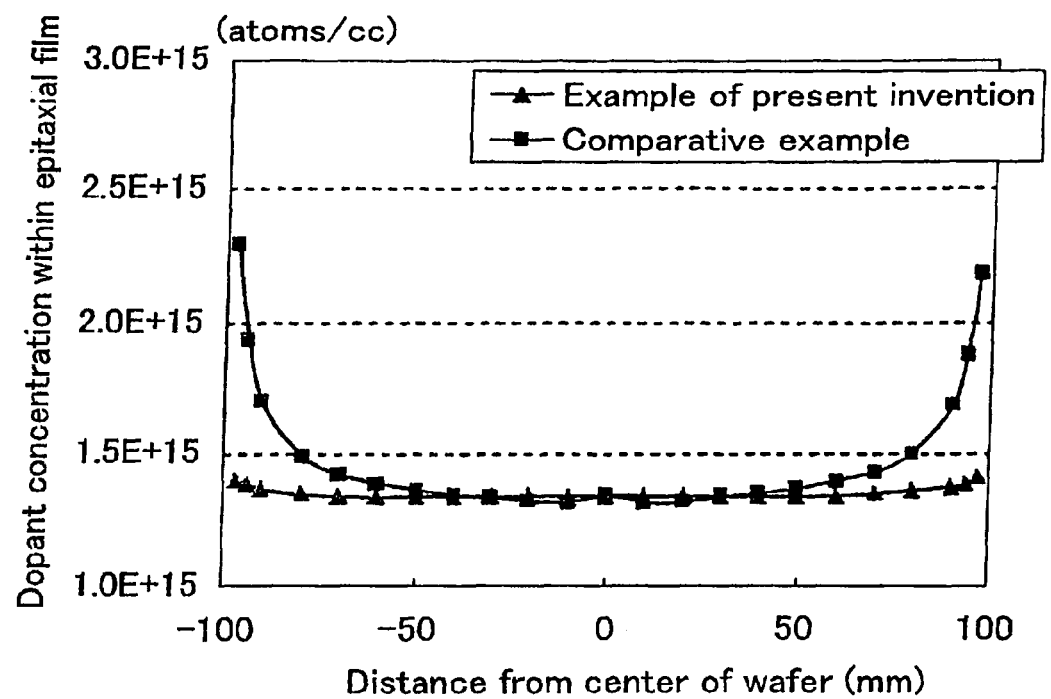
FIG. 12 is a graph showing distribution of dopant concentration in a radial direction of epitaxial films of epitaxial wafers obtained in a test example and a comparative example.
Figure 13:
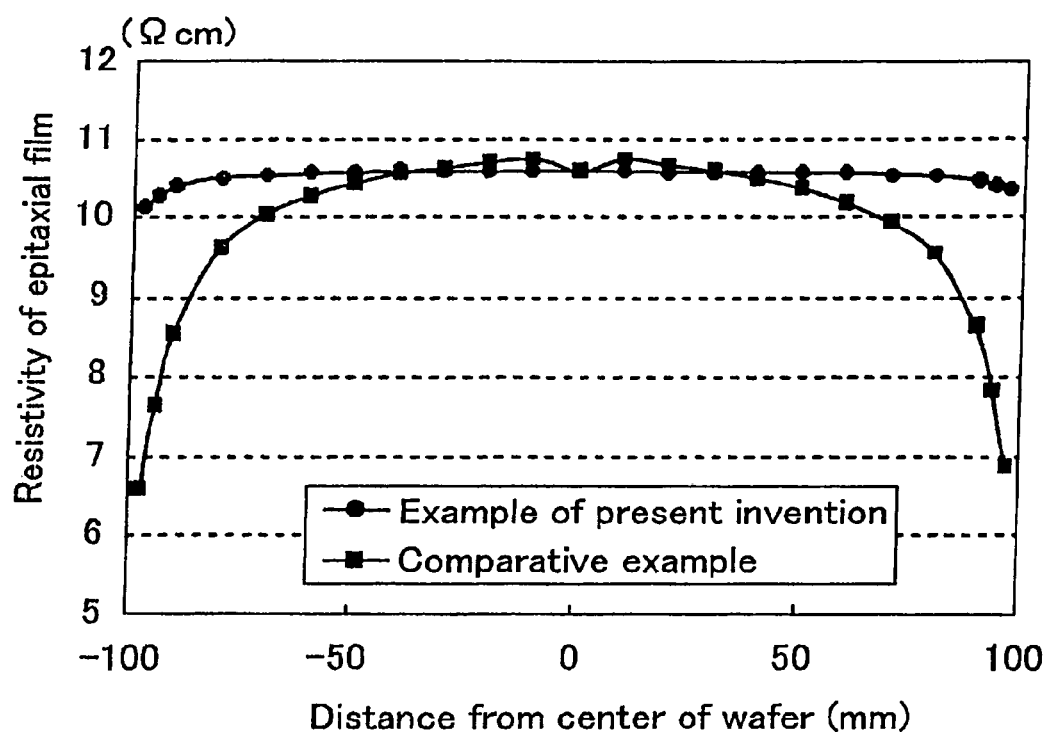
FIG. 13 is a graph showing distribution of resistivity in a radial direction of epitaxial films of epitaxial wafers obtained in a test example and a comparative example.

Dopant concentration distribution in a radial direction within the epitaxial film, with the exception of the region from the outer periphery to 3 mm, is measured using a surface charge profiler for the epitaxial silicon wafers obtained in the test example of this invention and in the comparative example, respectively. The results are shown in the graph in FIG. 12. Results obtained for resistivity distribution in a radial direction within an epitaxial film based on these measurement results are shown in FIG. 13. FIG. 12 is a graph showing distribution of dopant concentration in a radial direction of epitaxial films obtained in the test example and the comparative example, and FIG. 13 is a graph showing distribution of resistivity in a radial direction of epitaxial films obtained in the test example and the comparative example.

As is clear from FIG. 12 and FIG. 13, in the example of this invention, dopant is taken in in such a manner that dopant concentration within the epitaxial film is uniform in a radial direction and a p-type epitaxial film with a targeted resistivity of 10 Ωcm is obtained uniformly within the surface. On the other hand, dopant concentration is high at the outer periphery in the comparative example. It can also be understood that resistivity distribution falls accordingly by a substantial amount at the outer periphery.

Figure 14:
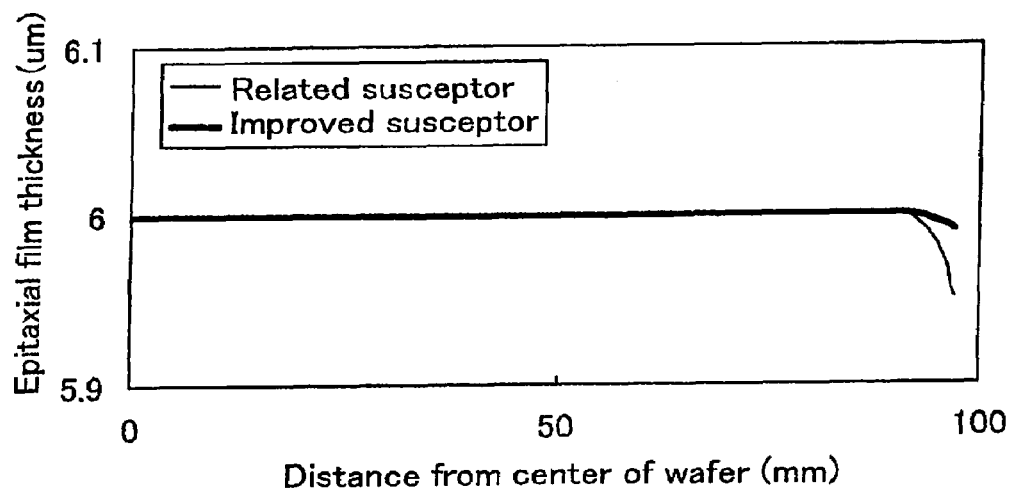
FIG. 14 is a graph showing changes in film thickness of epitaxial films of epitaxial wafers obtained in a test example and a comparative example.

Further, as shown in the graph in FIG. 14, the film thickness of the epitaxial film decreases at the outer periphery of the wafer and particularly in the region from 2 to 3 mm from the outer edge. The deterioration substantially relates to deterioration in flatness in the film forming step for epitaxial film forming. FIG. 14 is a graph showing changes in film thickness of epitaxial films of epitaxial wafers obtained in the test example and the comparative example.

With prior art susceptors, in the region from 2 to 10 mm from the outer edge of the wafer and more particularly in the region from 2 to 5 mm from the outer edge, the uniformity of film thickness of the epitaxial film deteriorates and the epitaxial film becomes dramatically thinner. The effect of this is that flatness (SFQR, etc.) after epitaxial growth is deteriorated substantially compared with flatness of the silicon wafer before epitaxial growth. With regards to this, the susceptor of this invention is capable of dramatically reducing the decrease in film thickness of the epitaxial film that otherwise occurs at the outer periphery of the wafer because using the susceptor of the present invention a sufficient amount of reactive gas is supplied to the edge regions.

Figure 15:
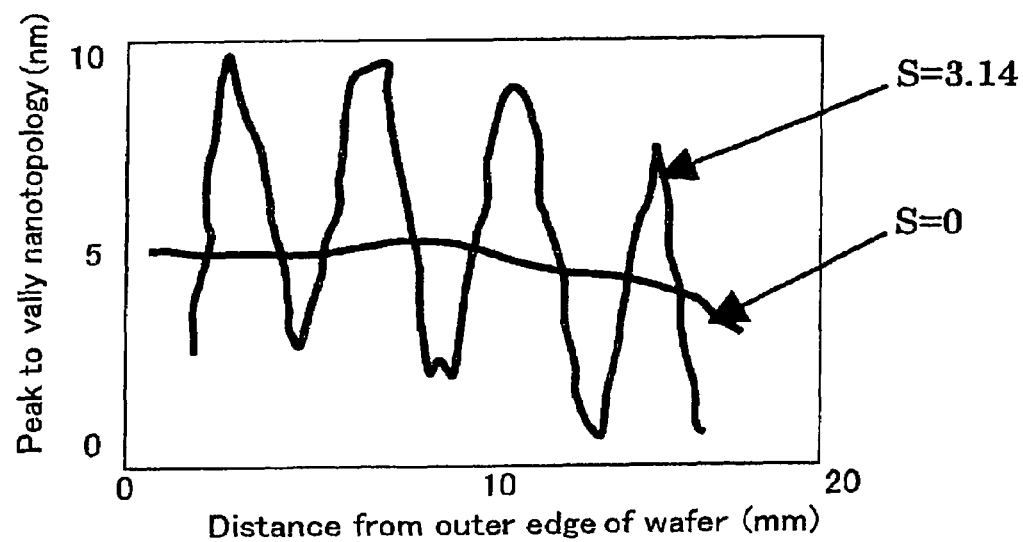
FIG. 15 is a graph showing peak to valley (P-V) nanotopology occurring in the outer parts of epitaxial wafers obtained in a test example and a comparative example.

Next, a description is given based on FIG. 15 of how nanotopographical degradation of the wafer surface is improved by forming a plurality of through-holes in only the outer peripheral region of the susceptor.

FIG. 15 is a graph showing nanotopography occurring in the outer parts of epitaxial wafers obtained in the test example and the comparative example. The nanotopology was measured by laser reflection angle from the wafer surface (as described in SEMI standard m43). In FIG. 15, the line graph for S=0 shows nanotopography for the case when a susceptor with a through-hole opening surface area of 0 mm$^2$ is used, i.e., when there are no through-holes formed in the outer periphery of the bottom wall, and the line graph for S=3.14 shows nanotopography for when a susceptor with through-holes of an opening surface area of 3.14 mm$^2$ (diameter 2 mm) formed in the outer periphery of the bottom wall is used. When, for example, through-holes are dispersed over the whole area of the bottom wall of the pocket, nanotopographical deterioration occurring due to temperature differences between regions where through-holes are formed and regions where through-holes are not formed occurs over the whole surface of the epitaxial wafer. However, in the present invention, through-holes are only formed in a region starting from the outside of the bottom wall to the center in a radial direction for a distance of up to ½ the radius. The portion of regions where there is no nanotopographical deterioration within the epitaxial wafer surface is therefore enlarged and a high-quality epitaxial wafer where the number of nanotopographically degraded regions has been reduced is obtained. A region from the center of the bottom wall of the susceptor to a radius of ½ is a region for measuring process temperature of the epitaxial growth apparatus. The through-holes are formed outside this region in this invention and the occurrence of slip to the epitaxial film can therefore be suppressed.

Figure 16:
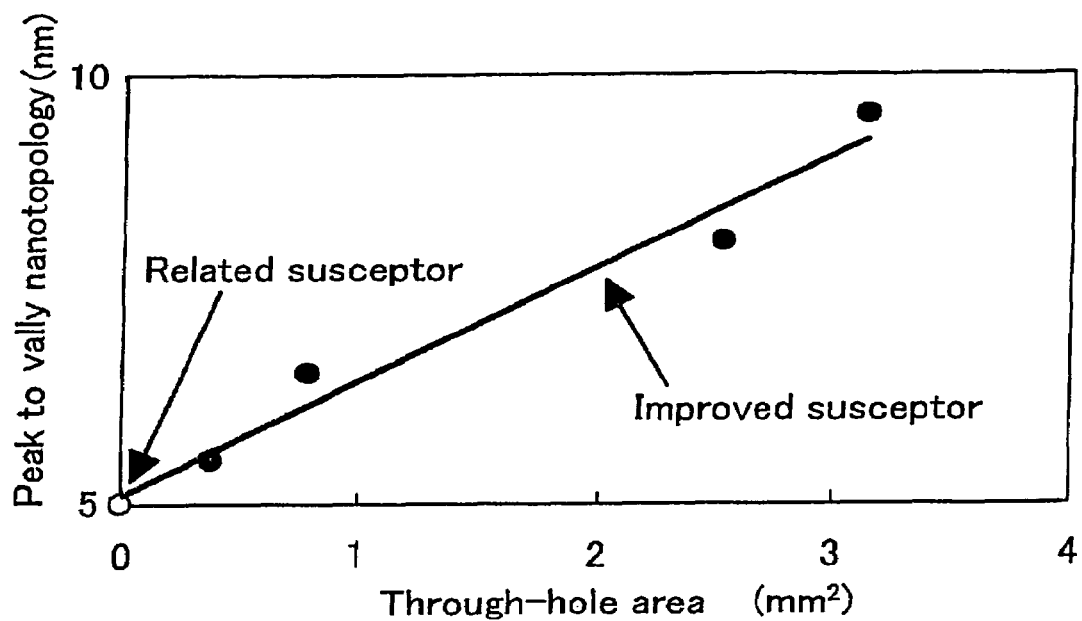
FIG. 16 is a graph showing the relationship between the surface area of the openings of through-holes and P-V nanotopography values for epitaxial wafers obtained in a test example and a comparative example.

Next, the relationship between opening surface area of through-holes and P-V values for through-hole forming parts for the susceptor of the present invention and a prior art susceptor is shown in FIG. 16. As is clear from the relationship between the opening surface area and the P-V value for the through-hole forming part, it is preferable for the opening surface area of the through-holes to be as small as possible so as to minimize the risk of nanotopographical degradation.

Figure 17:
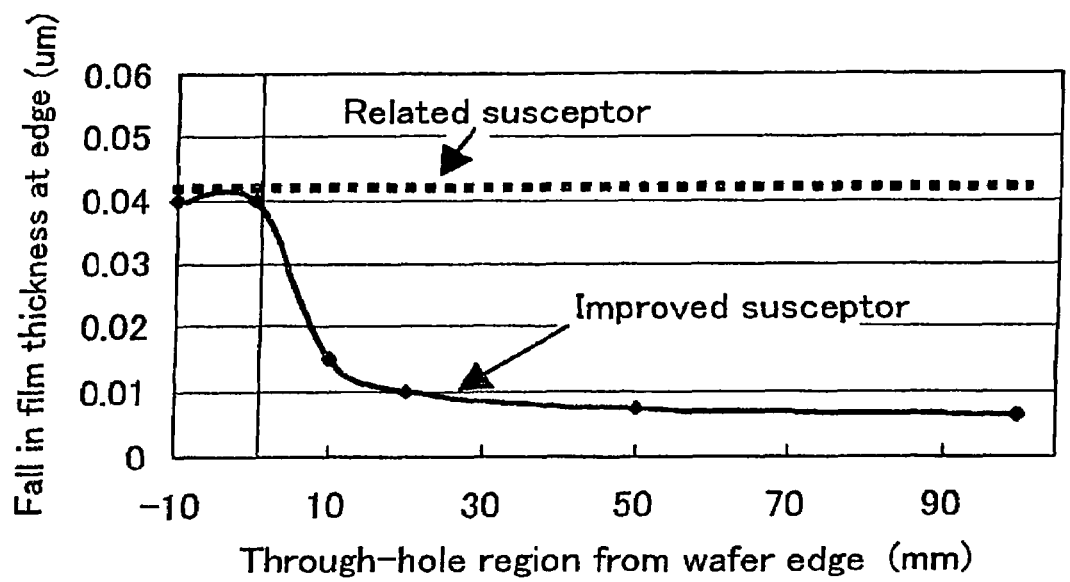
FIG. 17 is a graph showing the relationship between the region from the edge of a wafer where through-holes are provided and the extent of a drop or decrease in thickness of an epitaxial film at the outer edge of a wafer for epitaxial wafers obtained in a test example and a comparative example.

Next, a description is given using FIG. 17 of the relationship between the region where the through-holes exist and the extent to which film thickness of the epitaxial film decreases at the wafer edge region. FIG. 17 is a graph showing the relationship between through-hole forming regions and an extent of a drop in film thickness of an epitaxial film at outer parts of a wafer.

It can be understood from the graph of FIG. 17 that the dropping of film thickness can be prevented when through-holes are provided in the vicinity from the outer peripheral edge of the pocket of the susceptor up to at least 50 mm inwards (i.e., up to approximately half the length of the radius from the outside of the bottom wall of the susceptor to the center).

Figure 18:
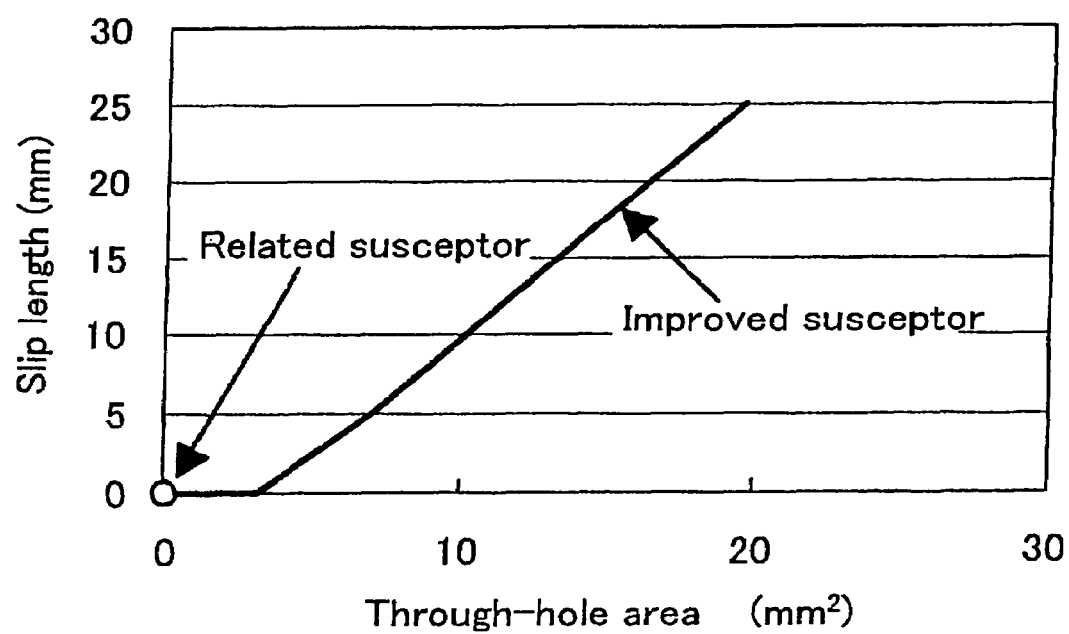
FIG. 18 is a graph showing the relationship between the surface area of the openings of the through-holes and the extent of slip for epitaxial wafers obtained in a test example and a comparative example.
Figure 19:
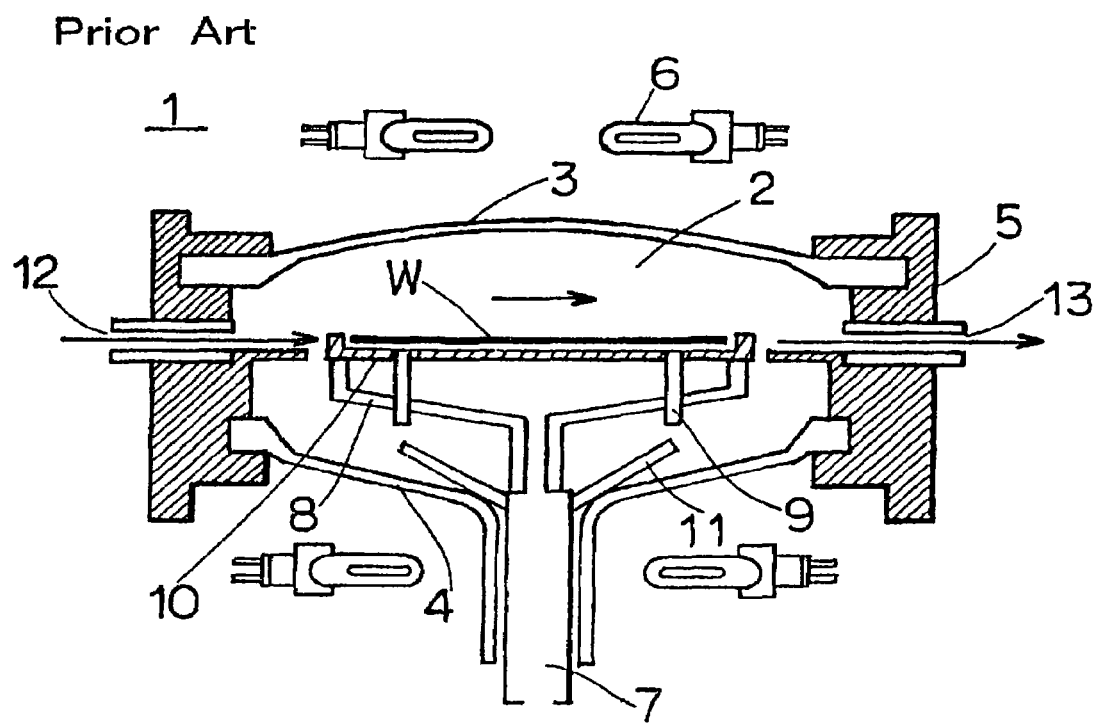
FIG. 19 is a cross-sectional view schematically showing an epitaxial growth apparatus of the prior art.

Next, a description is given of the through-hole opening surface area and the amount of slip using the graph showing the relationship between opening surface area of through-holes and the extent of slip for epitaxial wafers as shown in FIG. 18.

Regarding the opening surface area of the through-holes, considering cylindrical through-holes because of the limits of mechanical machining precision when forming the through-holes, it is considered not to be possible to form through-holes of less than 0.2 mm$^2$. Problems with nanotopographical degradation and the occurrence of slip also place constraints on through-holes of 3.2 mm² or greater. An opening surface area for the through-holes of 3.2 mm² or less is therefore necessary to give nanotopographical degradation of 10 nm or less and to prevent the occurrence of slip.

The rate of supplying reactive gas to the outer periphery of the wafer is also substantially changed due to the relationship between the through-hole opening surface area and the through-hole density. It is therefore preferable to arrange the through-holes as densely as possible in order that the influence of the flow of reactive gas to the lower side of the susceptor shown in FIG. 1 is uniformly high with respect to the circumferential direction of the wafer and in order to dramatically suppress the influence of autodoping and suppress reduction in epitaxial film thickness at the outer periphery of the wafer. The optimum range for the density of the through-holes is therefore 0.25 to 25 per cm² in order to take into consideration problems with the strength of the susceptor and through-hole machining precision.

A description has been given in the experimental example of a single wafer epitaxial growth apparatus but this invention is by no means limited in this respect and may also be applied to batch method epitaxial growth apparatus for treating a plurality of wafers at one time as implemented in the related art. Additionally, the method of the invention can also be applied to a Bernoulli chuck transfer apparatus.

As described above, according to this invention, the plurality of through-holes is provided within an outer periphery region in a radial direction from the outside of the bottom wall to the center over a distance that is up to about ½ of the radius, with the through-holes being included within at least the region of the bottom wall on which the semiconductor wafer is mounted. The total surface area of the openings of the through-holes is 0.05 to 55% of the surface area of the bottom wall, the opening area of each through-hole is 0.2 to 3.2 mm² and the opening density of through-holes is 0.25 to 25 per cm². Therefore, as a result, uniformity of thickness of the epitaxial film can be improved and nanotopographically degraded regions of the epitaxial wafer surface that occur due to a temperature difference between the regions where a plurality of through-holes are formed in the bottom wall of the pocket and regions where the holes are not formed can be reduced. Additionally, slip to the epitaxial film caused by the forming of through-holes in the bottom wall of the pocket can be prevented and the influence of autodoping from the rear surface of the wafer can be eliminated. Therefore, uniformity of dopant concentration within the epitaxial film surface can be improved.

In this invention, a support unit for supporting the mounted semiconductor wafer through surface contact, line contact or point contact with only the outer periphery of the semiconductor wafer is provided at the sidewall of the susceptor. Through-holes are provided in the susceptor within a region from this contact toward the center. This provides a substantial seal at the wafer edge and dopant, that is outgassing from the wafer rear surface, diffuses out the through-holes. As a result, the influence of autodoping from the rear surface can be minimized.

Further, SiC films are adhered to the surface of the susceptor and the inner wall surfaces of each through-hole or at least the inner walls of each through-hole of the susceptor are made from an SiC material. Wafer contamination caused by the susceptor base material can therefore be prevented.

Moreover, in this invention an epitaxial wafer can be made that is not influenced by autodoping even without forming a protective film for preventing autodoping at the rear surface of the wafer and, even in cases where a semiconductor wafer with dopant added to a high concentration is subjected to an epitaxial growth process, the cost of producing the epitaxial wafer can therefore be reduced.

According to the epitaxial growth method of this invention, dopant is discharged to the outside from the rear surface of the wafer during an epitaxial reaction and it is therefore possible to provide an epitaxial wafer with extremely low dopant concentration at the rear surface of the wafer. This depleted rear surface may be beneficial for subsequent processing by device manufacturers. When the epitaxial growth susceptor of this invention is used, problems with autodoping and problems with impurity contamination traceable to the susceptor structure are substantially resolved.

According to this invention, the through-holes may be inclined with respect to the thickness direction of the bottom wall. Radiant heat occurring at the part of the bottom wall where the through-holes are formed can therefore be suppressed, as can the occurrence of uneven brightness at the rear surface of the semiconductor wafer.

What is claimed is:

1. An epitaxial growth susceptor comprising a substantially circular bottom wall having an upper surface and a lower surface that forms a back surface of the susceptor and a sidewall encompassing the bottom wall to form a pocket for mounting a semiconductor wafer, having a clearance between a back surface of the semiconductor wafer to be mounted on the susceptor and the bottom wall, and a plurality of through-holes that pass through said bottom wall and form circular or polygonal openings in the upper surface and the lower surface of said bottom wall, an axis of each of the through-holes extending from the upper surface to the bottom surface of said bottom wall being a straight line, said plurality of through-holes being provided in the bottom wall only within a region of the bottom wall which is approximately half the radius of the bottom wall from the outer periphery to the center and which is located under the semiconductor wafer to be mounted on the susceptor and not between an outer edge of the semiconductor wafer to be mounted on the susceptor and said side wall, said plurality of through-holes being provided uniformly over the entirety of said region, and uneven portions are provided on a surface of the susceptor at an outer periphery of the susceptor on which the wafer is to be mounted so as to support the wafer by point contact, adjacent holes in a row of said through-holes in a bottom wall area located under the semiconductor wafer being connected by a channel to form a circular channel in an upper surface of the bottom wall of said pocket in the susceptor, said channel being a flat shallow channel having a width that is up to 1.5 times the diameter of a through-hole and a depth such that a cross-sectional area of a channel is from about 50% to about 100% an opening surface area of a through-hole.

2. An epitaxial growth susceptor comprising: a substantially circular bottom wall having an upper surface and a lower surface that forms a back surface of the susceptor and a sidewall encompassing the bottom wall to form a pocket for mounting a semiconductor wafer, having a clearance between a back surface of the semiconductor wafer to be mounted on the susceptor and the bottom wall; a support unit configured so as to support the semiconductor wafer by contacting an outer peripheral part of the semiconductor wafer without contacting a central part of the semiconductor wafer; and a plurality of through-holes that pass through said bottom wall and form circular or polygonal openings in the upper surface and the lower surface of said bottom wall, an axis of each of the through-holes extending from the upper surface to the bottom surface of said bottom wall being a straight line, provided in the bottom wall only within a region of the bottom wall which is approximately half the radius of the bottom wall from the outer periphery to the center and which is located under the semiconductor wafer to be mounted on the susceptor and not between an outer edge of the semiconductor wafer to be mounted on the susceptor and said side wall, said plurality of through-holes being provided uniformly over the entirety of said region, and adjacent holes in a row of said through-holes in a bottom wall area located under the semiconductor wafer being connected by a channel to form a circular channel in an upper surface of the bottom wall of said pocket in the susceptor, said channel being a flat shallow channel having a width that is up to 1.5 times the diameter of a through-hole and a depth such that a cross-sectional area of a channel is from about 50% to about 100% an opening surface area of a through-hole.

* * * * *